United States Patent [19]

Eytcheson et al.

[11] Patent Number: 5,517,059

[45] Date of Patent: May 14, 1996

[54] ELECTRON AND LASER BEAM WELDING APPARATUS

[75] Inventors: Charles T. Eytcheson, Kokomo; Donald E. Lake, deceased, late of Rochester, both of Ind., by Juanita Lake, administratrix; Patrick E. Tonies, Franklin, Wis.

[73] Assignee: Delco Electronics Corp., Kokomo, Ind.

[21] Appl. No.: 233,572

[22] Filed: Apr. 26, 1994

[51] Int. Cl.$^6$ ............................................. B23K 26/00
[52] U.S. Cl. .............. 257/699; 219/121.13; 219/121.63; 219/121.31; 219/520; 269/903; 269/153; 29/843; 29/825
[58] Field of Search ................... 257/780, 678, 257/672, 676, 699, 708, 724, 690–695, 698, 730, 727, 726; 29/842, 843, 825; 269/903.57, 153, 246; 219/121.13, 121.63, 121.31, 520, 121.12

[56] References Cited

U.S. PATENT DOCUMENTS

| | | | |
|---|---|---|---|
| 3,925,809 | 12/1975 | Striker | 257/724 |
| 4,593,005 | 8/1986 | Carlson et al. | 257/686 |
| 4,614,964 | 9/1986 | Sutrina | 257/726 |
| 5,063,318 | 11/1991 | Anderson | 257/691 |
| 5,146,303 | 9/1992 | Kornrumpf et al. | 257/459 |
| 5,414,298 | 5/1995 | Grube et al. | 257/690 |

FOREIGN PATENT DOCUMENTS

| | | | |
|---|---|---|---|
| 0277546 | 1/1987 | European Pat. Off. . | |
| 0427143 | 11/1989 | European Pat. Off. . | |
| 2452178 | 3/1980 | France . | |
| 0150871 | 7/1987 | Japan | 257/692 |

Primary Examiner—Robert P. Limanek
Assistant Examiner—Alexander Oscor Williams
Attorney, Agent, or Firm—Mark A. Navarre

[57] ABSTRACT

A method and apparatus for electron or laser beam welding of semiconductor subassemblies to larger terminal members, without exposing semiconductor chips in such subassemblies to detrimental welding "flash".

10 Claims, 9 Drawing Sheets

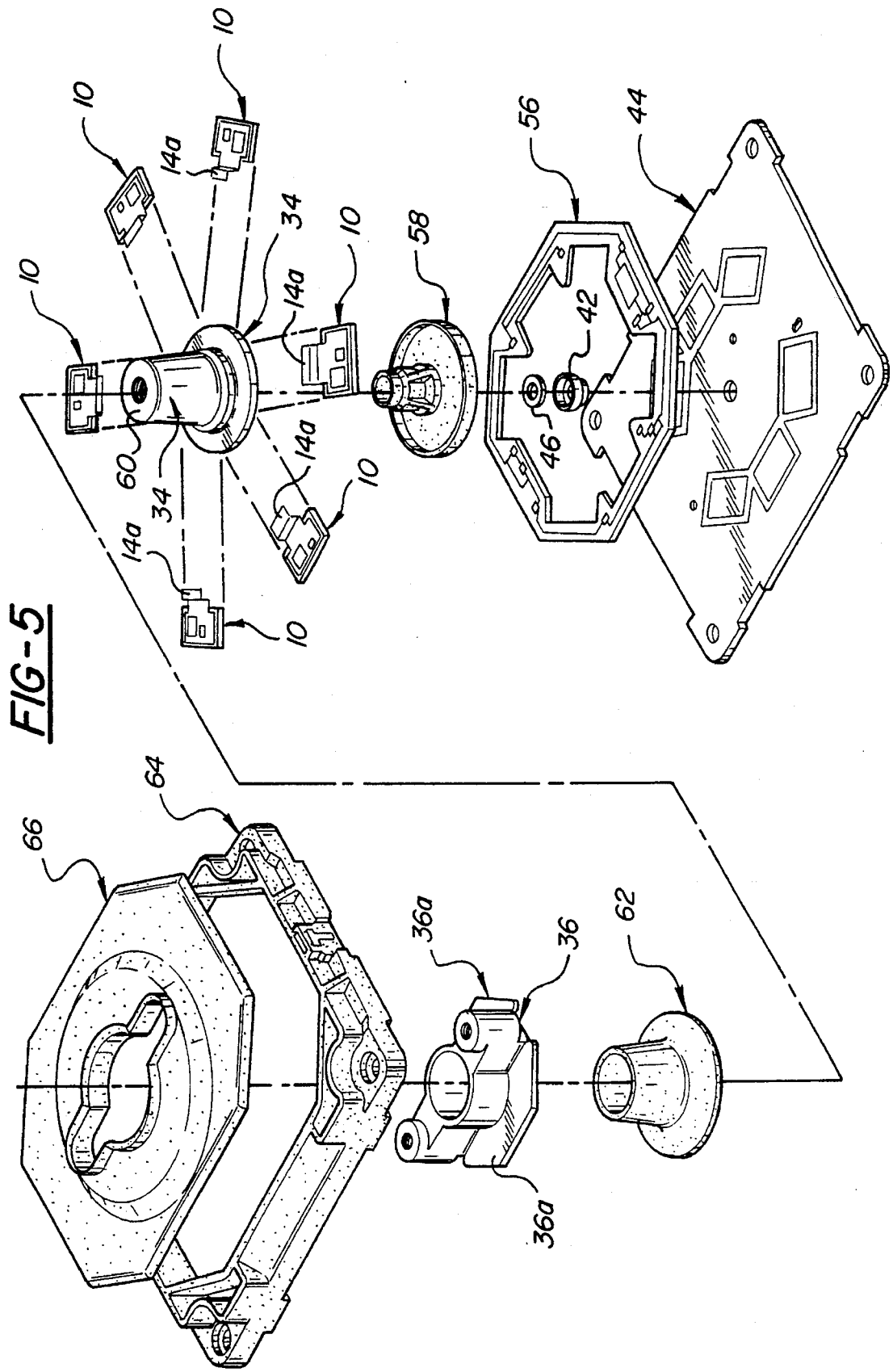

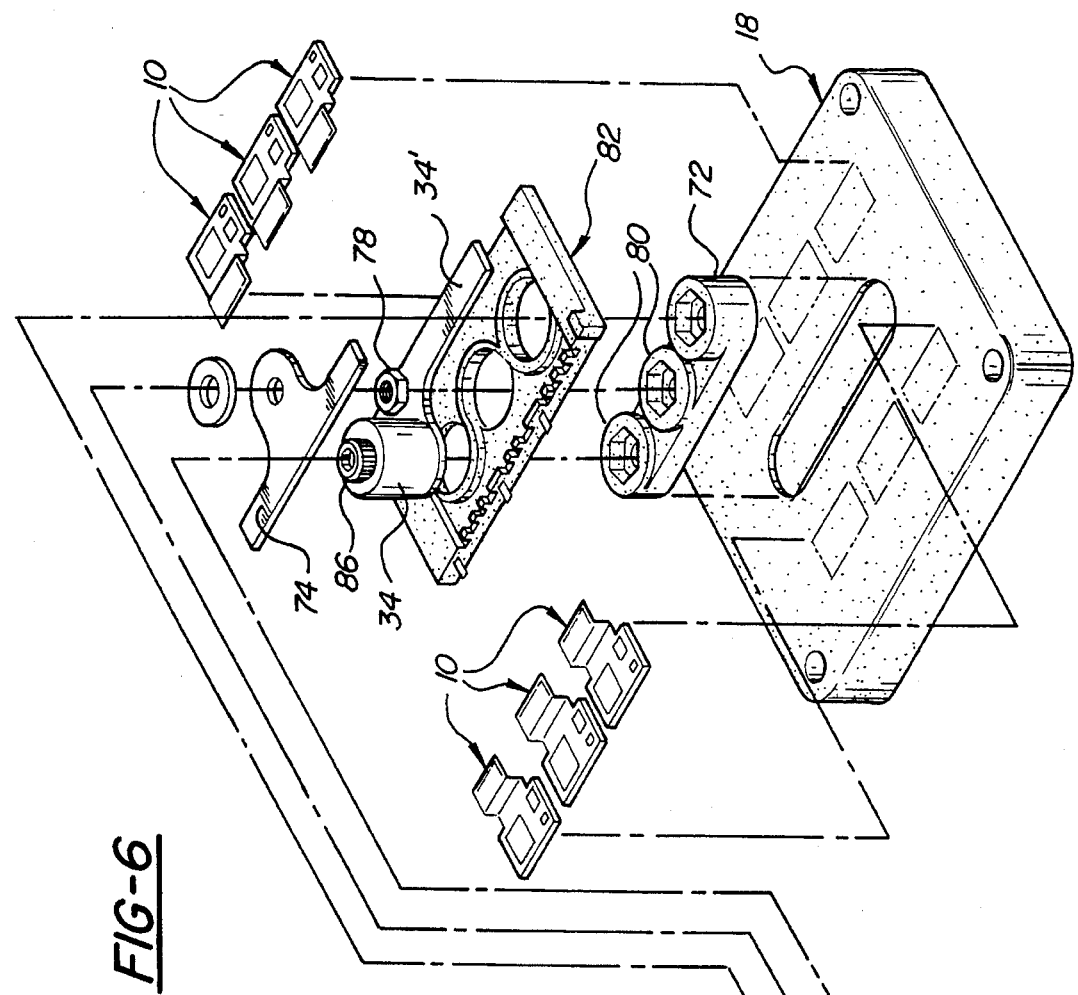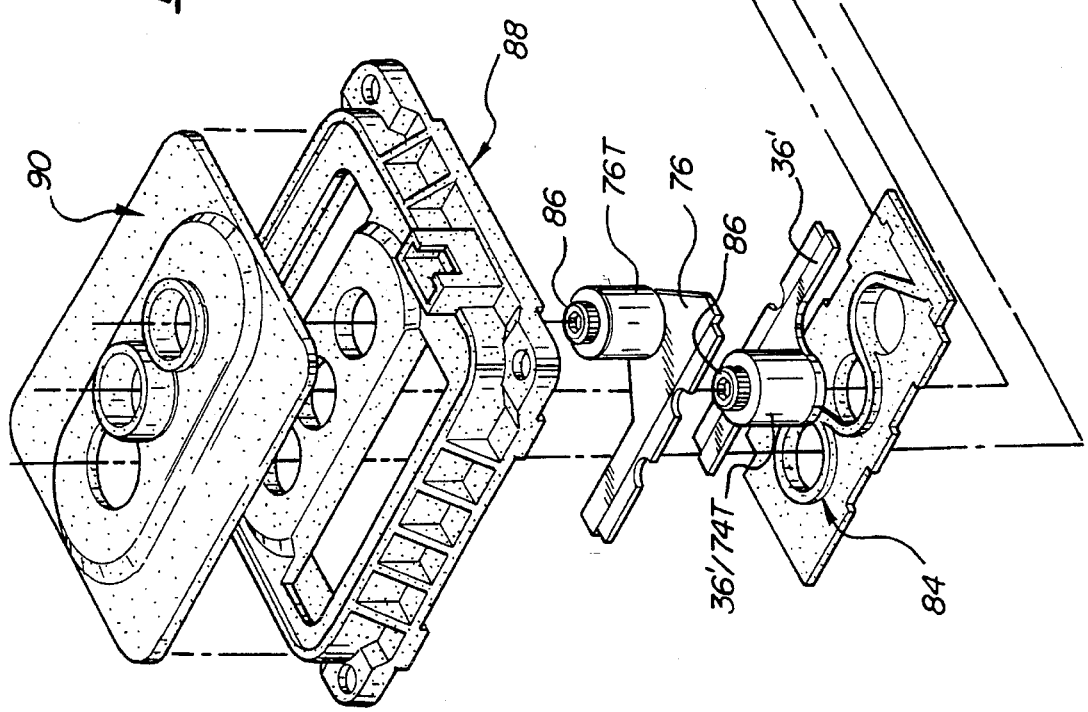

ELECTRON AND LASER BEAM WELDING APPARATUS

RELATED PATENT APPLICATIONS

This patent application is related to the following patent applications, all of which are assigned to the assignee of this patent application and the first four of which are incorporated herein by reference:

U.S. patent application Ser. No. 08/117,924, filed Sep. 7, 1993, and entitled "High Power Semiconductor Switch Module".

U.S. patent application Ser. No. 08/116,793, filed Sep. 7, 1993, and entitled "Coaxial Switch Module".

U.S. Pat. No. 5,444,295, issued Aug. 22, 1995, and entitled "Linear Dual Switch Module".

U.S. patent application Ser. No. 08/208,244, filed Mar. 9, 1994, and entitled "Substrate Subassembly and Method of Making Transistor Switch Module".

U.S. patent application Ser. No. 08/278,199, filed Jul. 21, 1994, and entitled "Triaxial Double Switch Module".

1. Field of the Invention

This invention relates to bonding terminals for semiconductor substrate subassemblies. More particularly, it relates to electron beam or laser beam welding of substrate subassembly tabs to terminal members for modules under commercial manufacturing conditions.

2. Background of the Invention

The above-mentioned related patent documents U.S. Ser. No. 08/117,924, U.S. Ser. No. 08/116,973, U.S. Pat. No. 5,444,295 and U.S. Ser. No. 08/208,244, disclose a substrate subassembly that includes a metallized thin rectangular ceramic substrate having two semiconductor chips thereon and an integral thin metal connector tab extending from one of the metallized surfaces. In a preferred embodiment, one surface of a second ceramic wafer is bonded to the metallized wafer surface that has the tab. The opposite surface of the second wafer is metallized, and also has a tab extending therefrom. More specifically, the wafers are of beryllium oxide and the metallizations are copper foil sheets bonded to the wafer surface. The tabs are integral extensions of the copper foil sheets beyond the wafer edge.

The bonded copper foil sheets become copper foil layers in a composite substrate. The copper foil layers are bonded to the opposed major surfaces of the beryllium oxide wafers by direct copper bonding. Direct copper bonding is a known technique by which copper oxide is used to bond copper metal to a ceramic.

The semiconductor chips are bonded to one of the copper foil layers, preferably by soldering, to form a resultant substrate subassembly. As indicated above, the copper foil layer to which the chips are soldered, has an integral tab portion that overhangs the beryllium oxide wafer edge. The tab projects out from the beryllium oxide wafer a short distance, but a distance long enough to permit easy attachment to a cooperating terminal member for the region of each chip contacting the copper foil layer. The tab, thus, provides an integral connector portion between the copper foil and the terminal member.

The substrate subassembly, as well as its manufacture and function, is the subject matter of U.S. patent application Ser. No. 08/208,244. Use of substrate subassemblies in modules is described and claimed in U.S. patent application Ser. No. 08/117,924. A coaxial single switch module having such substrates is the subject matter of U.S. patent application Ser. No. 08/116,793. A linear dual switch module having such substrates is the subject matter of U.S. Pat. No. 5,444,295.

The subject patent application shows that soldering of the substrate subassembly tabs to the module terminal members is not necessary. Instead, this patent application describes how such a connection can be simply made by electron beam welding or laser beam welding. This patent application describes a method and apparatus for such welding. Our method and apparatus quickly and effectively electron or laser beam welds the tab to the terminal members, and is suitable for high volume commercial manufacturing. Moreover, it allows all tabs of a module to be bonded in no more than two bonding operations, and preferably only one.

As indicated above, the substrate connector tab could be soldered to a copper terminal member. One might think that soldering would be preferred. Welding flash is very detrimental to unpackaged semiconductor chips. In addition, control of the welding process for applications such as this makes it appear that welding is impractical. On the other hand, we believe welding is better and simpler than soldering. Further, we have found a very simple way of using a laser or an electron beam that makes use of it practical in this application. In our technique, a continuous beam of fixed power can be used to bond a tab to a given terminal. Moreover, in our welding method and apparatus semiconductor chips are protected from welding flash.

In addition, our technique permits one to concurrently weld all tabs to a given terminal in a single welding operation. The single welding operation increases manufacturing rate, and minimizes exposure of the semiconductor chips to welding flash. Accordingly, our method is applicable to high volume and demanding applications, as for example automotive electric vehicle inverter commercial production applications.

Further, with coplanar terminal contact areas and substrate subassembly coplanar tab ends, all terminal connections for the substrate subassembly can be made in a single welding operation. Thus, our method and apparatus become even more attractive for high volume commercial applications.

SUMMARY OF THE INVENTION

This invention involves a method and apparatus for electron beam and laser beam welding of thin connector leads to relatively more massive elements, as for example terminal members. More specifically thin integral connector tabs of a semiconductor subassembly are bonded to a terminal member. The method involves disposing the tab on the terminal member contact surface, clamping the tab to the contact surface while leaving a significant portion of it exposed, and covering all of the substrate subassembly and edges of the tab. Preferably, the terminal member is also covered, or at least protected from welding flash. The method further involves subjecting a part of the exposed portion of the tab to an electron beam that produces the weld. Preferably, the weld is in the form of a stripe across the tab. The stripe can be produced with a stationary laser or electron beam, without turning the beam on or off, by simply moving the exposed part of the tab across the path of the beam.

In this invention, means are provided to concurrently weld the tabs of a plurality of substrate subassemblies to a coaxial terminal in one pass through the beam. Substrate subassemblies in a straight line are analogously welded to a linear terminal in one pass. All of the welds are made without turning the beam on and off, and without moving the beam.

A fixture is used that is clamped over the one or more substrate subassemblies, and its or their tabs, and the terminal member. It can be clamped by bolting to threaded means on the partially finished module. The clamping not only insures intimate contact between each tab and the terminal member but also is tight enough to protect the substrate subassemblies from welding flash. If the surface being welded has major conformations, the interior, or bottom, of the mask will have to have corresponding conformations, in order to allow the fixture to seat on the tabs. It is quite convenient to clamp the fixture to the module assembly being welded through bolt holes in the module assembly, particularly when the bolt holes are threaded.

Our welding fixture contains consumable portions that are exposed to the laser or electron beam. The consumable portions define the opposite ends of the welding stripe, and are preferably replaceable. Bolting of the mask to the terminal not only clamps the tab to the terminal for welding, but also provides the tight fit needed to prevent welding flash from reaching the chips of the semiconductor subassembly.

A unique fixture assembly is described for welding a plurality of tabs to a circumferential flange on a terminal. The fixture features replaceable consumable portions, that are disposed above the weld area and define facing ends of adjacent welding stripes.

DESCRIPTION OF THE DRAWING

FIG. 5 shows an exploded view of a coaxial single switch module in which substrate subassembly tabs are welded to a circumferential flange in accordance with this invention.

FIG. 6 shows an exploded view of a linear dual switch coaxial module in which substrate subassembly tabs are welded to opposed parallel linear edges of terminal plates in accordance with this invention.

DETAILED DESCRIPTION

Previously filed U.S. patent application Ser. No. 08/117,924, describes and claims a module having substrate subassemblies each of which contains a single switching transistor chip. U.S. patent application Ser. No. 08/208,244, describes tabs on such substrate subassemblies. Previously filed U.S. patent application Ser. No. 08/116,793, describes and claims a coaxial single switch module containing such substrate subassemblies. Previously filed U.S. Pat. No. 5,444,295, describes and claims a linear dual switch module having such substrate subassemblies. This patent application describes methods and fixtures for welding the tabs (of the substrate subassemblies) to terminal members in the modules.

Figure 1:
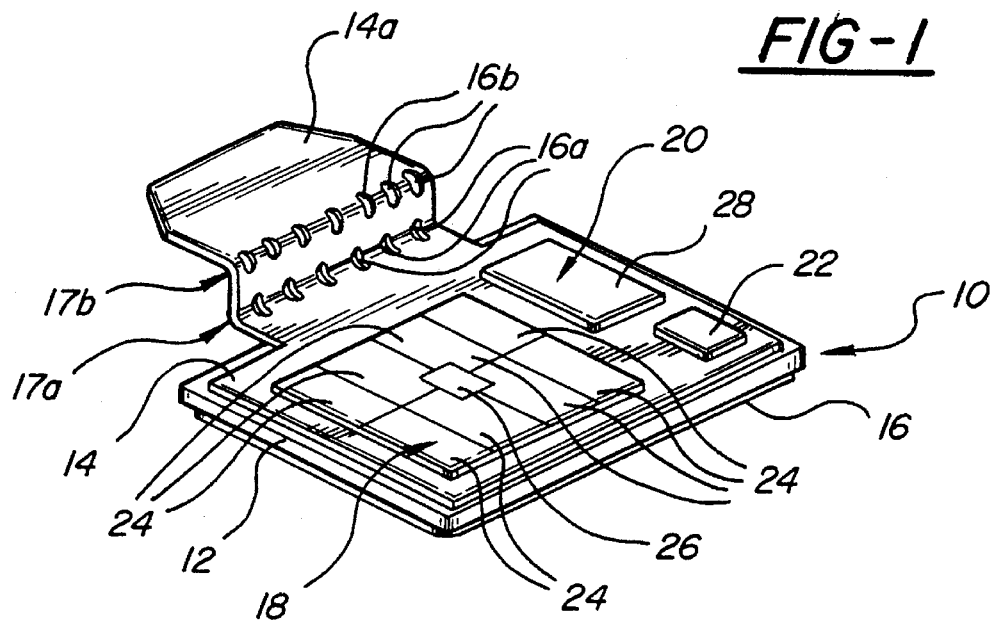
FIG. 1 shows a perspective view of a three layer substrate subassembly that has a tab extending therefrom for welding in accordance with this invention.
Figure 2:
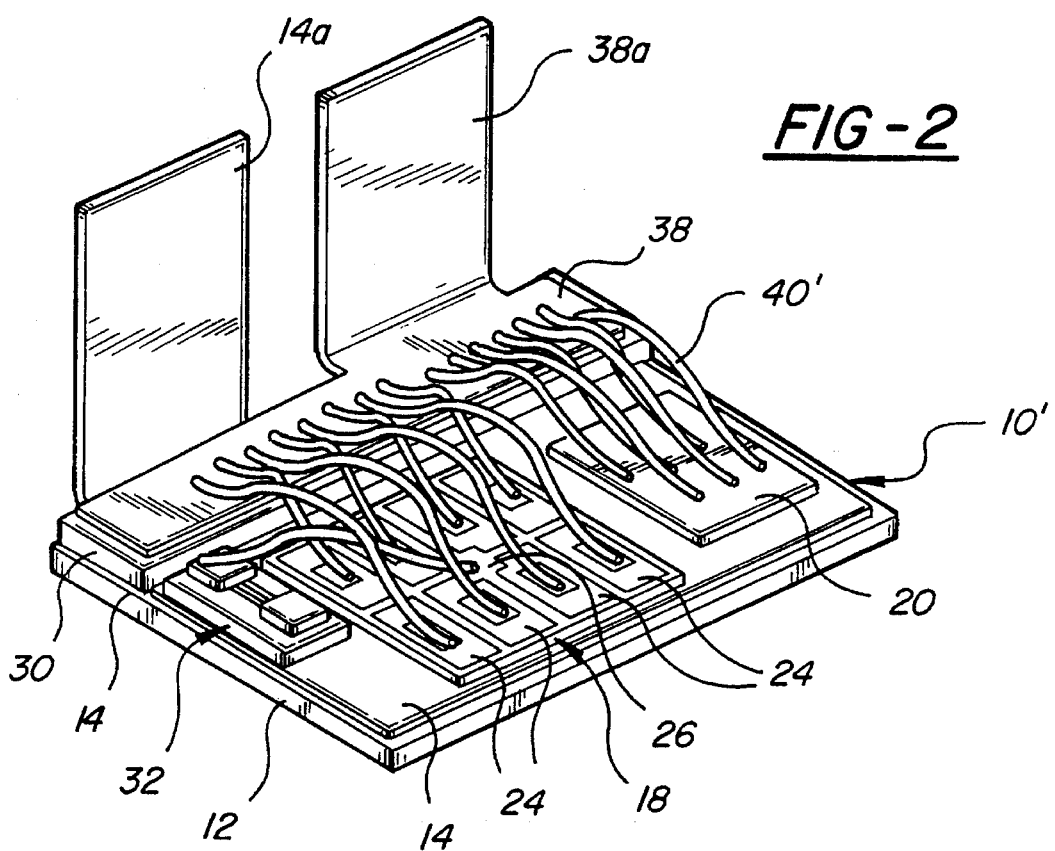
FIG. 2 shows a perspective view of a five layer substrate subassembly that has two tabs extending therefrom for welding in accordance with this invention.

The substrate subassemblies referred to in the preceding paragraph are shown in FIGS. 1 and 2. FIG. 1 shows a substrate subassembly 10 that comprises a 21 millimeters by 14.5 millimeters beryllium oxide plate or wafer 12 of about 1 millimeter in thickness. Beryllium oxide is a particularly effective dielectric material for use in this application. However, it is recognized that other ceramics such as aluminum oxide and/or aluminum nitride could be used. The dimensions of wafer 12, of course, can be varied. However, we prefer a thickness of about one millimeter if capacitance between upper and lower surfaces of wafer 12 is desired to be kept low. A copper foil plate or layer 14 is disposed on the upper surface of wafer 12. A copper foil plate layer 16 is disposed on the lower surface of wafer 12. Copper foil layers 14 and 16 are each about 20 millimeters by 13.5 millimeters and are about 0.25 millimeter thick. Copper foil layers 14 and 16 are secured to the major surfaces of beryllium oxide wafer 12 by any acceptable technique, as for example, direct copper bonding. Direct copper bonding is a known and accepted practice in which copper oxide is used to bond a copper sheet to a ceramic substrate.

Upper copper foil layer 14 has an integral generally rectangular extension, indicated by reference numeral 14a, that is about 14 millimeters wide and about 13.3 millimeters long. Accordingly, it overhangs wafer 12 by about 12.8 millimeters. The exposed portions of copper foil on top of the wafer, i.e., excluding tab 14a, has a 6.35–10.2 micron thick silver coating thereon to enhance solderability.

Extension 14a has a first row of holes 16a and a second row of holes 16b, that are mutually substantially parallel and are also substantially parallel the adjacent edge of wafer 12. The holes 16a and 16b are about 0.9 millimeter in diameter and are spaced apart on about 2 millimeter centers in each row. The center line of the row of holes 16a is parallel to the edge of the wafer and is spaced about 2.24 millimeters from the edge of the wafer. The center line of the row of holes 16b is parallel to the center line of the row of holes 16a, with the center lines of the rows being spaced about 2.36 millimeters apart. The row of holes 16a forms a first line 17a of stress relief in tab 14a. Line 17a is, thus, a first easy-bend line in tab 14a. The row of holes 16b forms a second line 17b of stress relief in tab 14a line 17b is, thus, a second easy-bend line in tab 14a. As can be seen in FIG. 1, tab 14a has two opposite right angle bends along bend line 17a and 17b, that form a step in tab 14a. This step facilitates connection of the substrate subassembly to a terminal member flange, as will be later apparent.

Figure 3:
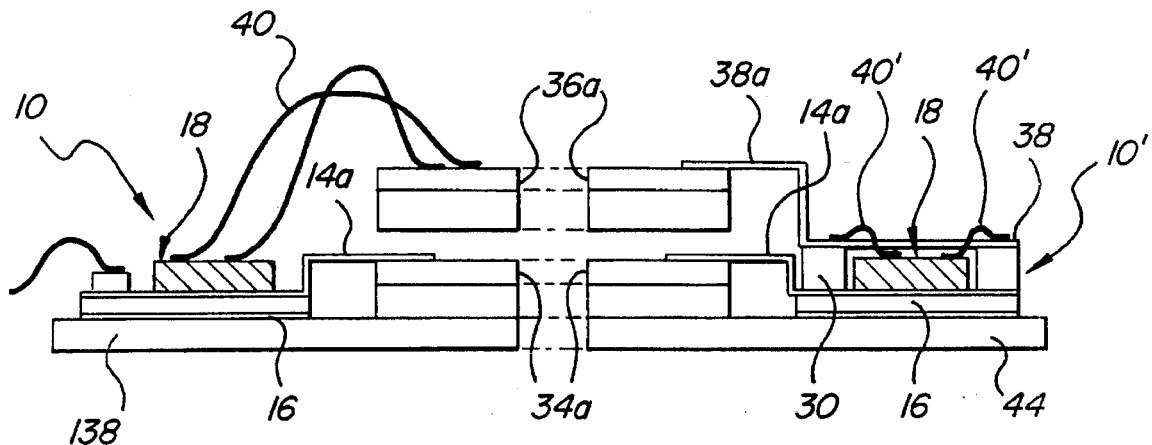
FIG. 3 shows a partial schematic sectional view comparing interconnects for the three layer and five layer substrate subassemblies.

The silicon semi-conductor switching transistor 18 such as an insulated gate bi-polar transistor (IGBT) or insulated gate field effect transistor (MOSFET), is disposed on the exposed major surface of the upper copper foil layer 14. A soft, fast silicon semi-conductor diode (SFD) 20 is also disposed on the exposed major surface of upper copper foil layer 14, next to switching transistor 18. The SFD is not an insulated gate semi-conductor switching transistor. It is a protection diode. A small plate 22, or pad, is also disposed on copper foil layer 14. The small plate 22 is present to facilitate bonding of an aluminum filamentary connecting wire to copper foil layer 14, to provide a kelvin connection or the like. If the filamentary connecting wire that is bonded to plate 22 is of aluminum, it is preferred that the small metal plate 22 have an aluminum upper surface. Small metal plate 22 can be of an aluminum/copper laminate with the copper side soldered face down on the outer surface of the upper copper foil layer 14. On the other hand, it is recognized that small metal plate 22 could be of any material that is metallurgically compatible with the filamentary connecting wire used. Analogously, the lower surface of small metal plate 22 can be of any material compatible with the process used to bond plate 22 to upper copper foil layer 14. The upper surfaces of switching transistor chip 18 and SFD chip 20 are appropriately metallized with aluminum or aluminum alloy. The majority of the upper surface of SFD chip 20 has a single electrode, while switching transistor chip 18 has a plurality of emitter contacts 24 that surround a central gate electrode 26. The emitter electrodes of the switching transistor chip 28 and the single electrode on the surface of the SFD chip 20 are in low electrical resistance communication with an input terminal. The communication is provided by an aluminum filamentary connecting wire, bonded for example by ultrasonics or thermocompression bonding, as shown in FIG. 3. Such connection is referred to herein as a "wire bond", the making of such an interconnection as "wire bonding".

Copper foil layers or sheets 14 and 16 form a composite substrate with wafer 12. The addition of switching transistor chip 18, SFD chip 20 and "wire bond" pad 22 to the composite substrate forms a substrate subassembly that is indicated by reference numeral 10. This substrate subassembly 10, its use and its function is broadly described and claimed in the above-mentioned related and previously filed U.S. patent application Ser. No. USSN 08/117,924. It is more specifically described and claimed, as are methods of its use, in the above-mentioned related U.S. patent application Ser. No. 08/208,244. As previously indicated, the disclosure regarding substrate subassembly 10 is hereby incorporated by reference. It should be understood that while we prefer to use beryllium oxide for wafer 12, other ceramics might be useful too as for example, aluminum nitride and aluminum oxide. Also, while we prefer to use copper foil as plates or layers 14 and 16 on wafer 12, we recognize that others may prefer to use other metals, or laminates of other metals.

FIG. 1 shows a composite substrate which we view broadly as being of copper/beryllium oxide/copper (Cu/BeO/Cu). Hence, FIG. 1 shows a three layer substrate subassembly. FIG. 2 shows a substrate subassembly 10' having a composite substrate with five layers along the side of the composite substrate adjacent to tabs 14a and tabs 38a. The five layer composite substrate 10' of FIG. 2, involves a lower copper foil sheet or layer 16 (not shown in FIG. 2) a beryllium oxide wafer 12 and copper foil sheet or layer 14 on the upper face of wafer 12. Copper foil layers 14 and 16 and wafer 12 of substrate subassembly 10' are identical to what was hereinbefore described for substrate subassembly 10 in FIG. 1.

Accordingly, similar reference numerals are used but copper foil layer 14 is referred to as a middle layer, instead of upper layer. Also, integral extension 14a of copper foil layer 14 does not have any holes in it, such as holes 16a and 16b in FIG. 1. It has been found that in most instances it is not necessary to provide any special stress relief in tab 14a. Tab 14a will normally bend satisfactorily without stress relief. One reason is that copper foil layer 14 is so thin that it does not have appreciable springback when bent.

As previously indicated the five layer substrate subassembly 10' shown in FIG. 2 has an additional beryllium oxide wafer, or layer, 30 on top of middle copper foil layer 14. As seen, the additional beryllium oxide layer 30 is long and narrow. It is disposed on middle copper foil layer 14 along its edge 14 from which tab 14a extends. The second beryllium wafer 30 is actually a narrow bar of beryllium oxide that is about 21 millimeters long and about 3–4 millimeters wide. It is thus as long as wafer 12 but only about ⅕ to ¼ as wide.

An upper copper foil layer 38 is disposed on upper surface of the additional beryllium oxide wafer or layer 30. Copper foil layer 38 is of the same thickness and composition as layer 14 and includes an integral extension tab 38a. The portion of upper copper foil layer 38 that is disposed on additional wafer 30 is about 20 millimeters long and about one millimeter narrower than additional wafer 30, so that it is recessed about 0.5 millimeter in from the edges of additional wafer 30. Tab 38a is generally similar in dimensions to tab 14a.

Upper copper foil layer 38 is only as wide as is necessary to provide a "wire bond" site for filamentary connecting wires extending from the electrodes 24 on transistor chip 18 and the electrode 28 on SFD chip 20. Beryllium oxide bar 30 is only wide and long enough to support upper copper foil member 38, and maintain upper copper foil 38 electrically insulated from middle copper foil layer 14. The lower surface of chips 18 and 20 are preferably soldered to the middle copper foil layer 14. Accordingly, the lower surfaces of chips 18 and 20 are in low electrical resistance communication with output tab 14a. As indicated, the filamentary wires connect electrodes on the upper surfaces of transistor chip 18 and SFD chip 20 to upper copper foil layer 38. Hence, those electrodes of transistor chip 18 and SFD chip 20 are in low electrical resistance communication with input tab 38a.

The five layer substrate subassembly 10' shown in FIG. 2 also contains a trimmable resistance element 32, which is bonded to an exposed surface portion of middle copper foil layer 14. The trimmable resistor chip 32 can be a small rectangular plate of ceramic having a thick film, i.e., cermet, resistor pattern printed along its length, with wire bondable metal-like printed conductors at opposite ends of the resistor pattern. A filamentary wire extends from the conductor at one of the resistor ends to the gate electrode 26 at the center of switching transistor chip 18. The inclusion of trimmable resistance 32 in the five layer substrate subassembly is more fully described and claimed in the aforementioned U.S. patent application Ser. No. 08/208,244.

Figure 4:
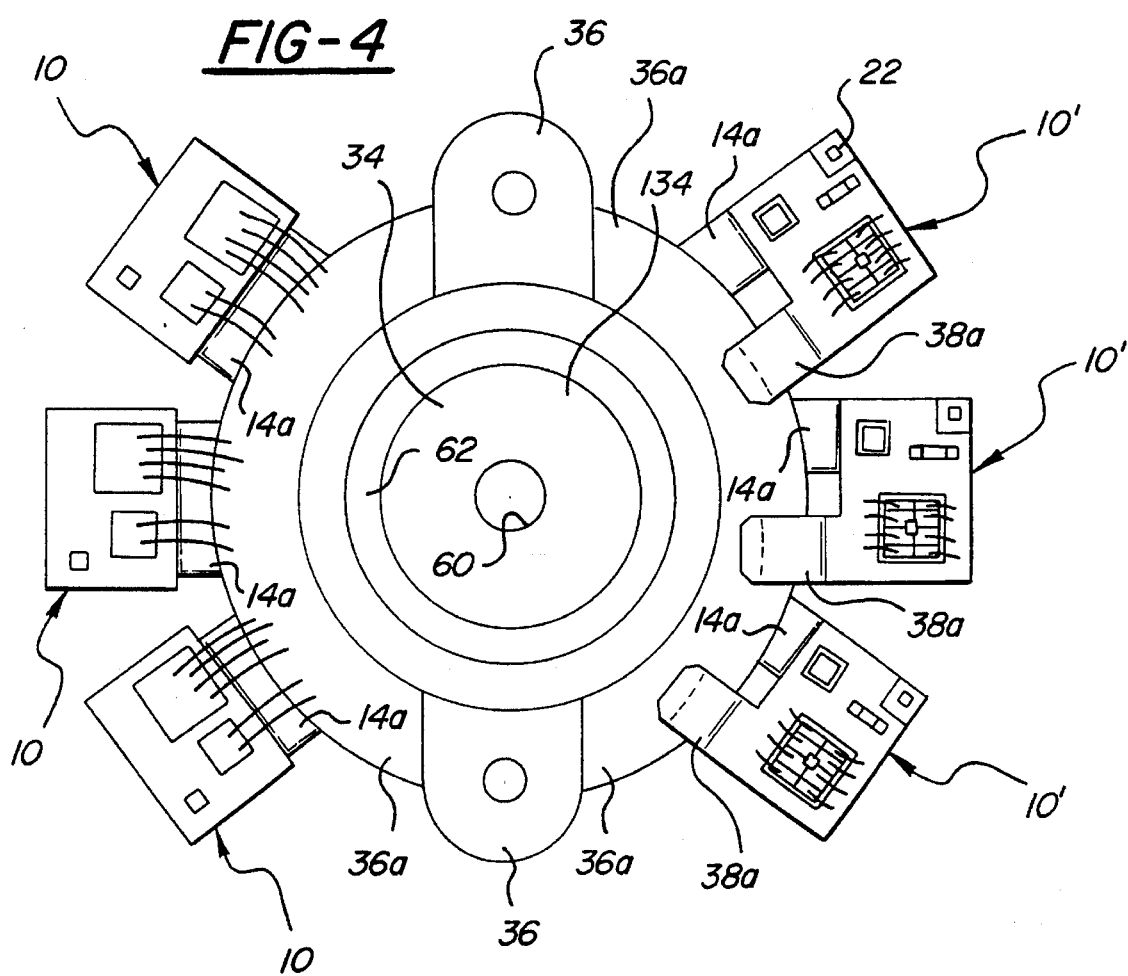
FIG. 4 shows a partial schematic plan top view comparing interconnects for the three layer and five layer substrate subassemblies.

A variation of our five layer substrate subassembly 10' is shown on the right in FIGS. 3 and 4. In this variation, beryllium oxide layer 30 extends across the entire exposed surface of middle copper foil layer 14 that is over wafer 12.

Selected portions of middle copper foil layer 14 are exposed by providing windows or apertures in the additional beryllium oxide wafer, or layer, 30. The windows in the beryllium oxide layer 30 are sized to respectively accept the transistor chip 18, SFD chip 20 and trim resistor chip 32. The beryllium oxide wafer 30 also has a notch in one corner that exposes a corner of the middle copper foil layer 14. A wire bond pad 22 is soldered to this exposed corner of copper foil layer 14. It should be mentioned that the five layer substrate subassembly 10' shown in FIG. 2 could also incorporate a wire bond chip 22 in its front corner, adjacent to the trim resistor chip 32.

As hereinbefore indicated, this invention involves the electron or laser beam welding of tabs on the substrate subassemblies 10 and 10' to terminal members while protecting chips of the substrate subassemblies from welding flash. Welding of the tabs 14a and 38a are each done in a similar manner. To illustrate similarities and differences in bonding our three layer and five layer substrate assemblies to terminal members, both are shown in FIGS. 3 and 4. However, in practice, one would probably form a module using all three layer substrate subassemblies or all five layer substrate subassemblies, not a mixture.

In any event, the comparison shown in FIGS. 3 and 4 include a three layer substrate subassembly 10 on the left side of each figure and a five layer substrate subassembly 10' on the right side of each figure. If the terminals are not coplanar, they would probably be stacked in register, one over the other, as shown for the circumferential flanges of coaxial terminal members 34 and 36 in FIGS. 3 and 4. One preferably starts with all the substrate subassemblies 10 and 10' already bonded to a module baseplate, with tabs 14a and 38a on the inward edge of the substrate subassemblies, and bent straight up as shown in FIG. 2.

The coaxial terminal members 34 and 36 are bonded to the center of the module baseplate with their circumferential flanges adjacent the substrate subassembly tabs 14a and 38a. If the flanges are stacked, tabs 14a of all substrate subassemblies 10 and 10' are first welded to the lowest terminal flange 34a of the innermost coaxial terminal 34. For welding, tabs 14a are then bent over the circumferential flange 34a, and welded as hereinafter described.

Following the welding of tabs 14a to circumferential flange 34a, a low resistance electrical connection is made to the upper circumferential flange 36a of the outer coaxial terminal 36. For our three layer substrate subassemblies 10 (on the left side of FIGS. 3–4), filamentary connecting wires 40 are "wire bonded" between electrodes on the surface of switching transistor 18 and SFD 20 and the circumferential flange 36a. For our five layer substrate subassemblies 10' (on the right side of FIGS. 3–4), tabs 38a are bent over circumferential flange 36a, and welded as hereinafter described. This connects outer terminal 36 with chips 18 and 20 of substrate subassemblies 10', because filamentary wires 40' were previously bonded between copper foil layer 38 and the top surfaces of chips 18 and 20.

FIG. 5 shows six three layer substrate subassemblies 10 arrayed around circumferential flange 34a of inner coaxial terminal 34 of a single switch module. In this invention, each of the tabs 14a would be concurrently welded to flange 34a in a single welding operation. As previously indicated, the module shown in FIG. 5 is the subject of previously filed U.S. patent application Ser. No. 08/116,793. Accordingly, it shall only briefly be described.

The module of FIG. 5 includes a base plate 44 centering elements 42 and 46. An annular circuit board 56 is concentric with and surrounds the circularly arrayed substrate subassemblies 10. Circuit board 56 provides means for supplying gate voltage to switching transistor chips 18 on substrate subassemblies 10. Terminal 34 would be recessed within a coaxial plastic locator element 58. When assembled, the upper surface of circumferential flange 34a is at or above a circumferential rim on plastic spacer element 58. A second coaxial plastic spacer 62 is disposed above inner coaxial terminal 34. An outer coaxial terminal 36 disposed on second plastic spacer 62. The entire assembly is surrounded by housing 64 and cover 66. The substrate subassemblies should be soldered to base plate 44. The coaxial terminal elements, the housing and the cover can be adhesively bonded.

FIG. 6 shows a module that uses the same three layer substrate subassemblies 10. However, the module of FIG. 6 is a dual switch, and is linear in configuration. This module is the subject of U.S. Pat. No. 5,444,295. Accordingly, it shall only be briefly described.

In the FIG. 6 module, the substrate subassemblies 10 are arrayed in two parallel and spaced straight lines. The module includes a liquid cooled hollow base plate 68 to which the two lines of three layer substrate subassemblies 10 are soldered. A nut retainer member 72, having recesses 80 for nuts 78, is included for disposition within a central elongated aperture 70 in base plate 68. A first plastic spacer 82 would be located on the surface of base plate 68 over the nut retainer member 72, and between the two lines of substrate subassemblies. Coplanar flat terminal plates 74 and 34 would be disposed on the first plastic spacer 82, and located thereon with respect to the two lines of substrate subassemblies. A second plastic spacer 84 is disposed over terminal plates 74 and 34', and located on said first plastic spacer 82. A second pair of coplanar and flat terminal plates 76 and 36' are disposed on and located by second plastic spacer 84. A housing member 88 and cover element 90 would surround the two lines of substrate subassemblies. Terminal connection members 34T, 36T and 35'/74T would project out up from the terminal plates through cover 90. Center terminal 36'/74t would be clamped to both the upper right terminal plate 36' and the lower left terminal plate 74, by means of bolt 86 and nut 78.

Substrate subassembly tabs 14a (not shown) of the right line of substrate subassemblies 10 would be welded to lower right plate 34' in accordance with this invention. Substrate subassembly tabs 14a (not shown) on the left line of substrate subassemblies 10 would be welded to lower left plate 74. More specifically tabs 14a would be welded to the upper surface of these plates, along their outer, i.e., linear, edges. If the substrate subassemblies were of our five layer type, and each had a second tab 38a (not shown) the additional tabs would be welded to the upper surface of both upper terminal plates 76 and 36', along the outer edges of these plates.

Preferably, all the tabs 14a respectively along the edges of coplanar terminal plates 34' and 74 would be welded in one welding step. All the tabs 14a respectively along the edges of terminal plates 36' and 74 would be welded in another single welding step. The balance of the components would be adhesively bonded, unless otherwise noted.

Figure 7:
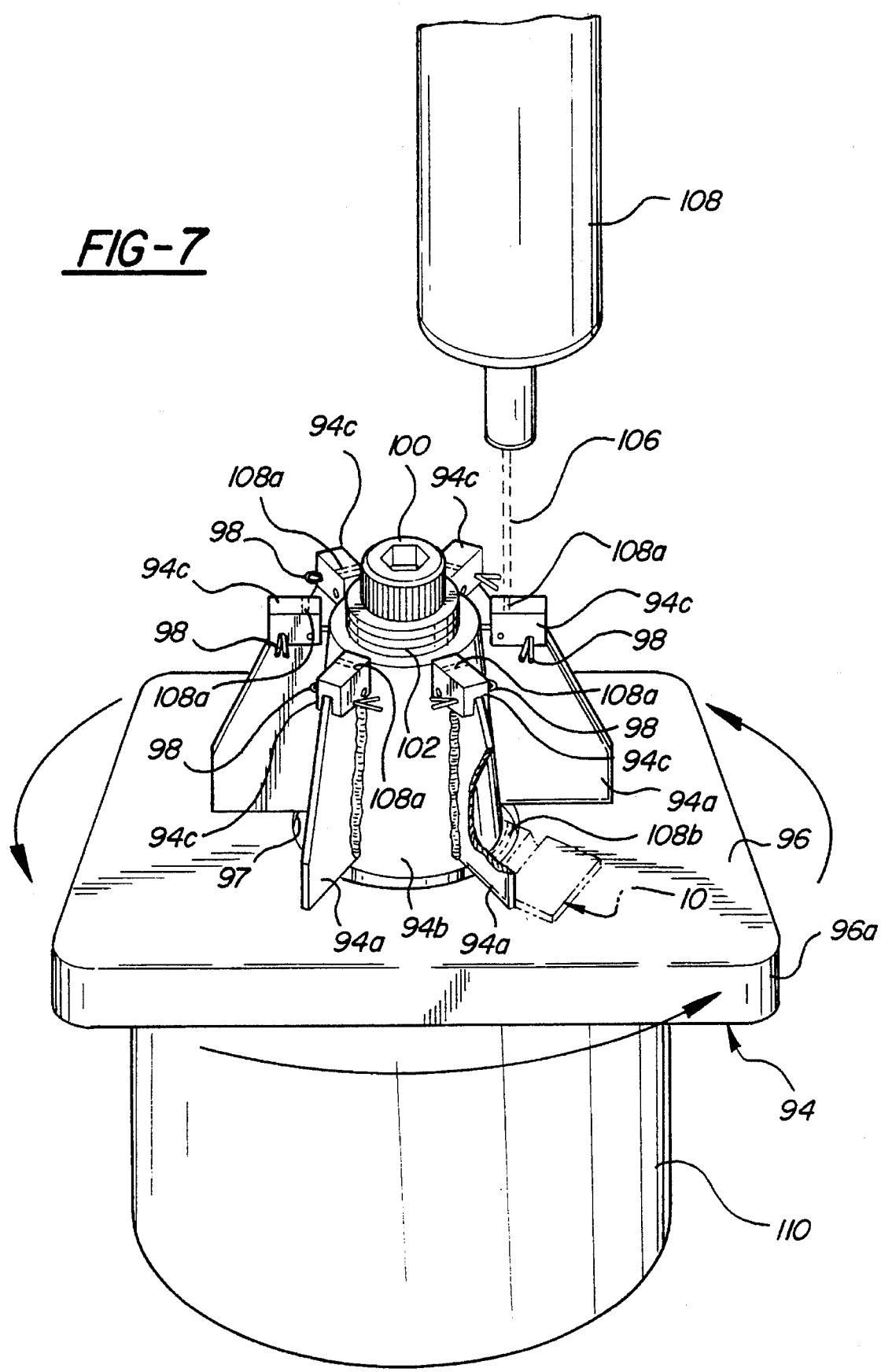
FIG. 7 shows a perspective view during welding of substrate subassembly tabs to a module coaxial terminal in accordance with our invention.
Figure 8:
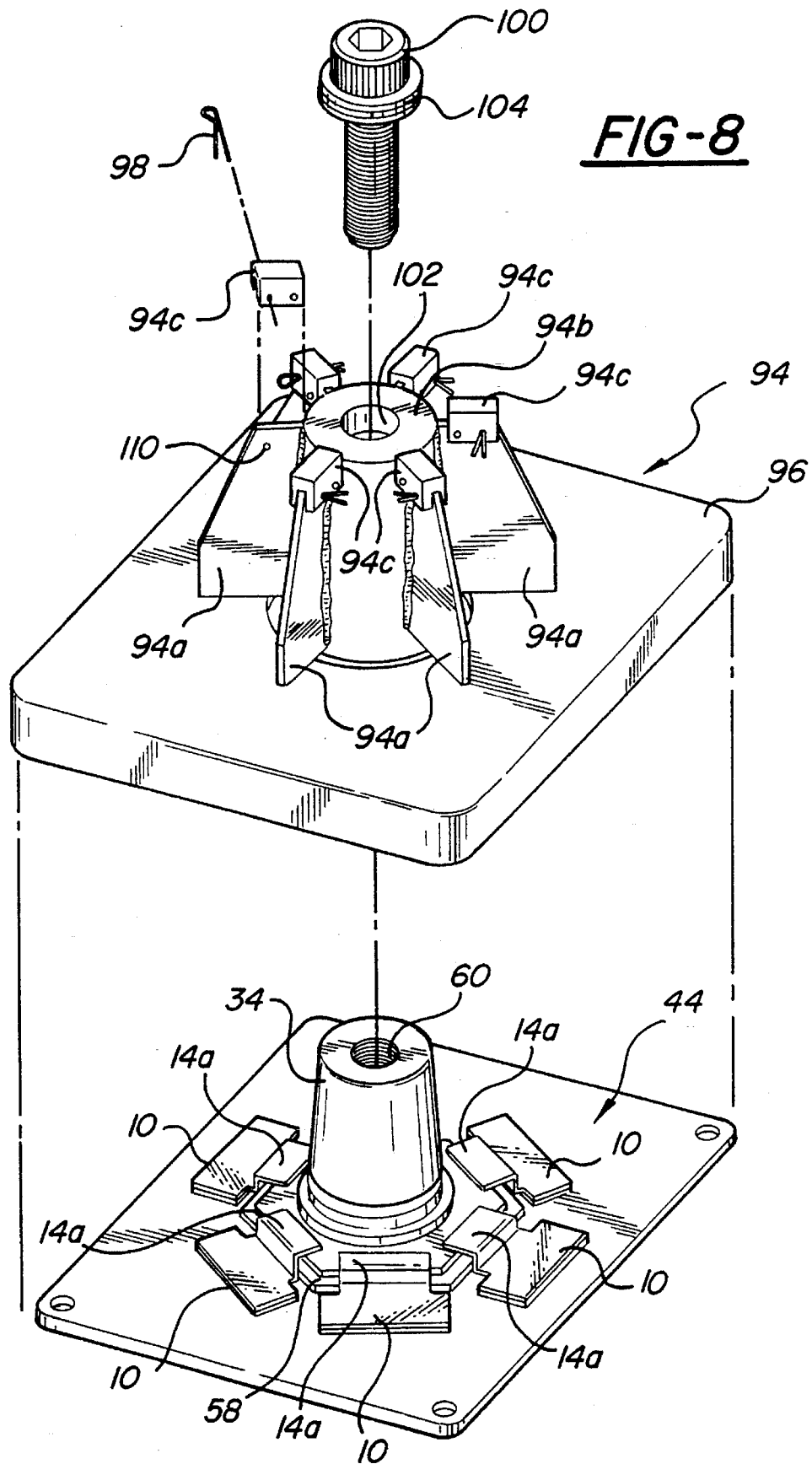
FIG. 8 shows an exploded perspective view of the welding fixture and module assembly being welded in FIG. 7.
Figure 9:
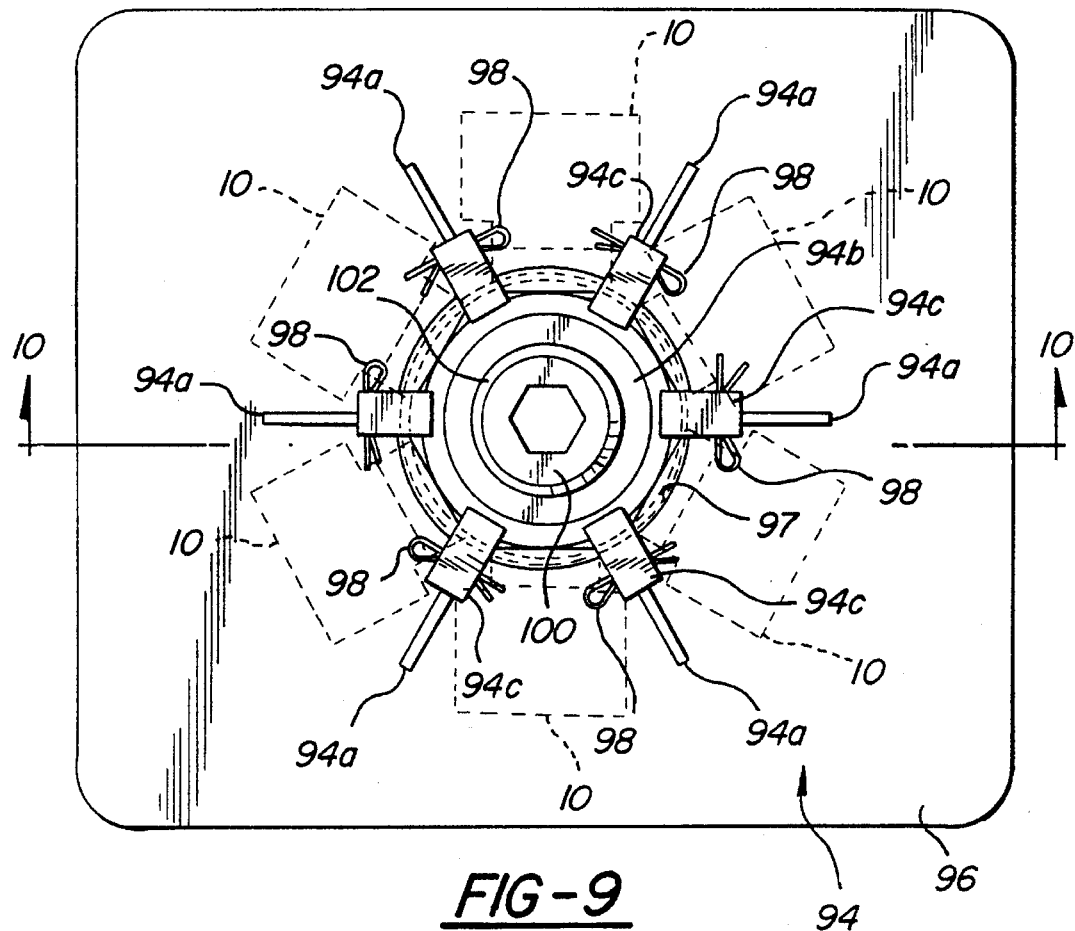
FIG. 9 shows a top plan view of the welding fixture shown in FIGS. 7 and 8, with substrate subassemblies of the module being shown in phantom lines.
Figure 10:
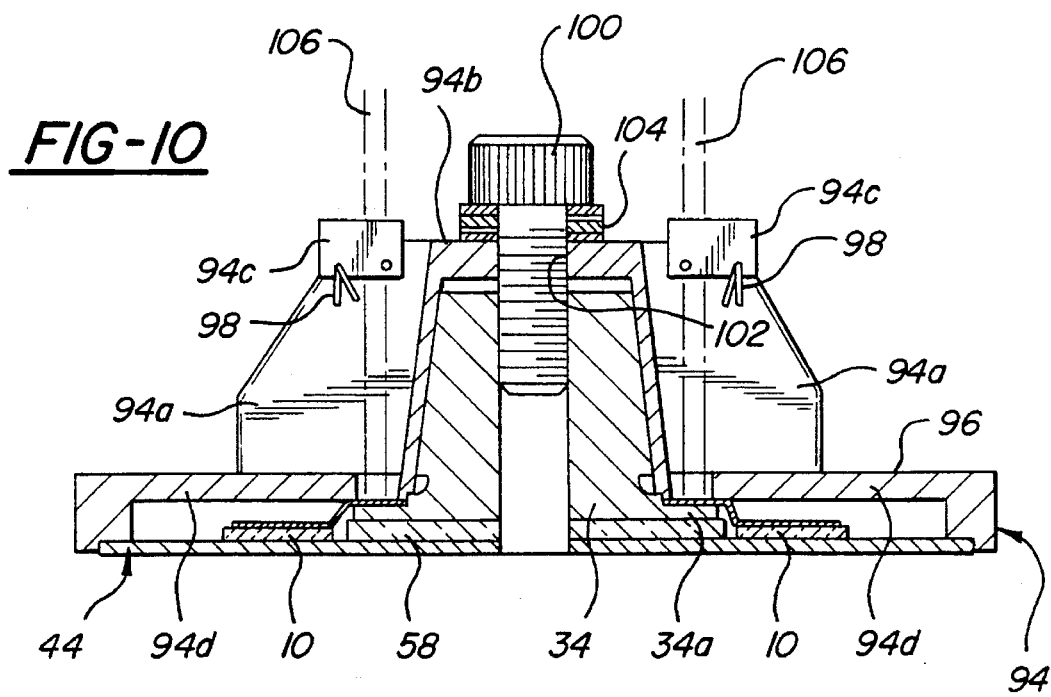
FIG. 10 shows a sectional view along the line 10—10 of FIG. 9.

Reference is now made to FIGS. 7–8. FIGS. 7–8 show the welding of substrate subassembly tabs 14a such as illustrated in FIGS. 3–5. The substrate subassembly tabs are welded to terminal flange 34. The welding method uses a fixture 94 that isolates all of the substrate subassemblies from welding flash but leaves central portions of the welding tabs 14a exposed to a welding beam. The beam would be from an electron beam welder or a laser welder.

The welding fixture 94 of FIGS. 7–10 includes a plate-like base element 96 having a depending peripheral skirt. Baseplate 44 of the module nests within skirt 96a in a fairly close fitting relationship, which aligns the tabs 14a of the substrate subassemblies 10 under circular gap 97 of fixture 94. Gap 97 is in fact an annular space between a circular aperture in base element 96 and a coaxial inverted cup shaped center element 94b of the fixture 94. The circular aperture in base element 96 is concentric with the coaxial terminals 34 and 36, and has a diameter somewhat less than the smallest radial dimension of the outer periphery of flange 34a on terminal 34. Thus, if the outer periphery of flange 34a were circular, it would have a diameter somewhat less than the diameter of the aperture in base element 96 of the fixture 94. The inverted cup shaped member has a circular lip in close proximity to base element 96. The outer diameter of the lip of inverted cup shaped member 94b is large enough to cover the free, i.e., convergent or inner, ends of all of tabs 14a. The lip of inverted cup 94b and the lower surface of base element 96, surrounding aperture 97, are substantially coplanar. Thus, the cup lip and the edge of aperture 97 cooperate to clamp tabs 14a against terminal flange 34a while leaving a band of each tab 14a exposed. The width of gap 97 is not particularly critical. We prefer that it be wide enough to allow formation of at least two concentric weld arcs in the exposed band on each tab 14a. Both of the weld arcs would, of course, be located on top of flange 34a.

Inverted cup shaped member 94b is supported on base element 96 by members 94a, which can be considered to be flying buttresses or gussets. The lower edges of cup support members 94a are welded or brazed (not shown) to the upper surface of base element 96. The side edges of cup support members 94a are welded to the side of inverted cup-like element 94b. The upper surface of base element 96 and/or the side surface of inverted cup shaped member 94b can have locating conformations, such as grooves and/or abutments (not shown) to facilitate coaxial orientation of cup-shaped member 94b in aperture 97. Plate-like base element 96, the cup-shaped member 94b and the buttresses 94a can all be of aluminum.

A slotted copper block-like element 94c is disposed on the top edge of each of the buttresses 94a. As will be seen better in connection with FIGS. 9–10, the copper blocks 94c are in line with the weld beam 106, and serve to interrupt it above the edges of tabs 14a. More will be said later about this function of blocks 94c. A cotter key 98 extends through a first aperture in each of the copper elements 94c, as well as through a corresponding aperture in the top of each of the buttresses 94a. It can be seen that each of the copper elements 94c has a second aperture therein. The second aperture permits each copper element 94c to be reversed on its buttress. Thus, after the blocks incur excessive wear from exposure to welding beams, they can easily be repaired. Each new block can be repaired once, without replacement, by simply reversing and reinstalling it. This reversal aspect doubles the lifetime of copper elements 34c and 94c.

The interior of cup-shaped portion 94b has a conformation to accommodate the outer periphery of terminal 34, and is substantially coaxial therewith. Its interior is slightly larger than terminal 34, to permit some clearance to exist when the fixture 94 is placed over terminal 34. However, cup-shaped member 94b has a thin enough wall to provide an outer periphery small enough to produce a suitable gap 97 or annular opening between it and the aperture 97 in base element 96. As indicated above, gap 97 can be of any dimension that will accommodate an electron or laser welding beam. Generally, we have used a gap of about 3 millimeters when the aperture 97 is about 43 millimeters. It should also be mentioned that the base of inverted cup-shaped member 94b, actually its top when inverted, has a central bore 102 therein. Bore 102 is coaxial with the axis of the cup and the center of aperture 97.

The underside of plate portion 96 is flat in a plane perpendicular to the axis of cup 94b, at least surrounding aperture 97. As indicated above, the bottom edge of inverted cup-shaped member 94b is coplanar with the flat lower surface surrounding aperture 97. It should also be mentioned that the bottom edge of the inverted cup-shaped member 94b is also flat so that its outer edge and the edge of aperture 97 effectively clamp tabs 14a to flange 34a. Fixture 94 is clamped against tabs 14a by a bolt 100 that extends through central aperture 102 in the upper, i.e., closed, end of cup-shaped element 94b. Bolt 100 is threaded into threaded recess 60 in the center terminal 34. Predetermined clamping pressure can be applied using washers 104 that could include a lock washer, a spring washer or the like.

As can be seen, when bolt 100 is tightened on terminal 34, fixture 94 is clamped against terminal flange 34a, with tabs 14a in between. This forms a tight seal at the inner and outer edge of the tabs, which protects the remaining parts of substrate subassemblies 10 from welding flash from the weld beam 106. It is recognized that there is no seal for the width of the gap 97 at the side edges of tabs 14a. However, it has been found that this little side edge exposure is small enough and indirect enough to cause no significant detrimental problem.

As can be seen in FIG. 7, a laser or electron beam welding apparatus 108 is used that will provide a substantially collimated energy beam 106. The laser or electron beam welding head is mounted in a fixed position, with its beam parallel to the axis of rotation of a movable welding fixture support mechanism, indicated by reference numeral 110. Accordingly, rotatable support member 110 is located with this rotatable parallel to but offset from electron or laser beam 106. The offset is positioned so that welding beam 106 impinges in the gap 97. The welding fixture is coaxially positioned on rotatable support, so that the welding beam 106 stays within gap 97 when the rotatable support is rotated on support member 110. Fixture locating means (not shown) should be included on support member 110 to facilitate coaxial positioning of fixture 94 on support 110.

Also, it should be mentioned that our fixture allows welding without turning the welder on and off for each discrete weld. Accordingly, sophisticated on/off control of the laser is not needed. This simplifies the weld process enough to allow many commercially available electron or laser beam welders to be used in our invention. Moreover, this simplicity reduces wear of the welder. Analogously, no special rules are needed to perform the weld in accordance with this invention. Any of the normal and accepted operating practices for such welders can probably be used.

Substrate subassembly tabs 14a can be welded to the respective terminal plates 34' and 74 of the linear switch module shown in FIG. 6. However, in this latter case, a much simpler welding fixture (not shown) can be used. For the FIG. 6 module, the fixture need only be a generally rectangular copper plate having a three millimeter wide aperture in it corresponding to each substrate subassembly tab 14a that is to be welded. The aperture is preferably a slot that has a length less than the width of tab 14a. Hence, when properly positioned, over the tabs 14a and plates 34' and 74 for welding, no edges of the tabs 14a are left exposed. In other words, only an interior portion of each tab would be exposed during welding, and the plate seals all the way around the weld opening. In this way, welding flash is confined to the aperture, and not allowed to extend to any of the chips on the substrate subassemblies 10.

Welding could be in a single step, with the beam traversing from row to row while still on. Instead, we prefer to weld each row separately, with the beam being turned of when moving from one row to the other in a given module.

If the linear dual switch uses the five layer substrate subassembly shown in FIG. 2, the substrate subassembly has a second connector tab to be welded. It is connector tab 38a. The second connector tabs 38a of all the substrate subassemblies in the module of FIG. 6 can be analogously welded to terminal plates 36' and 76T in a second welding operation. A similar copper plate (not shown), having appropriately disposed welding slots, would be used. All connector tabs 38a in a given row would be laser or electron beam welded at one time.

Means would be provided to locate the fixture on the module for welding. An aperture in the plate would be needed to accommodate the terminal posts 34, 36'/74T and 76T, if they are in place at the time. Means would also be provided to clamp the masking copper plate against the terminal plates, i.e. the module baseplate. However, since this masking fixture is just a flat plate, the terminals 34, 36'/74T and 76T are not protected from welding flash.

Figure 11:
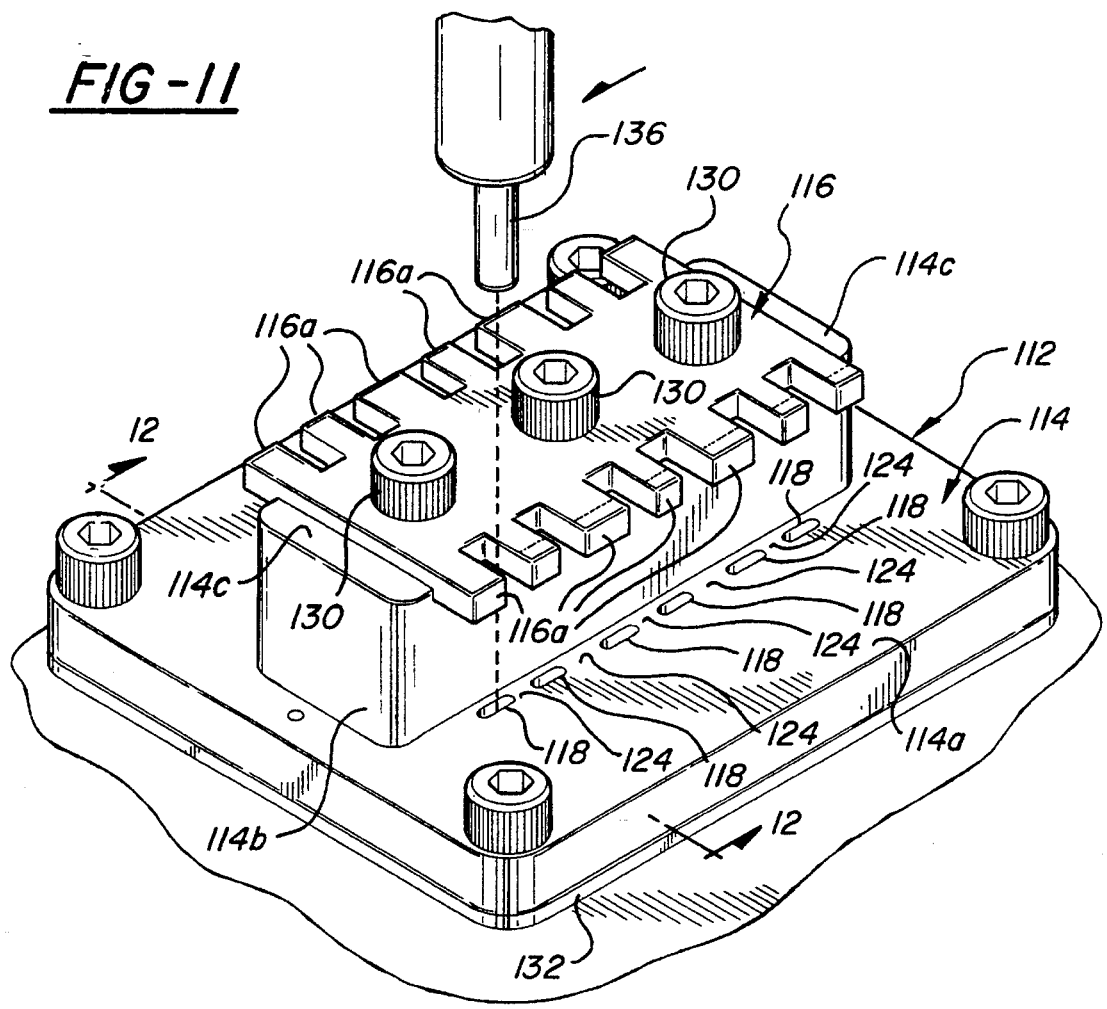
FIG. 11 shows a perspective view of a welding fixture attached to a baseplate subassembly of a coplanar dual linear module, during welding with a beam welder.
Figure 12:
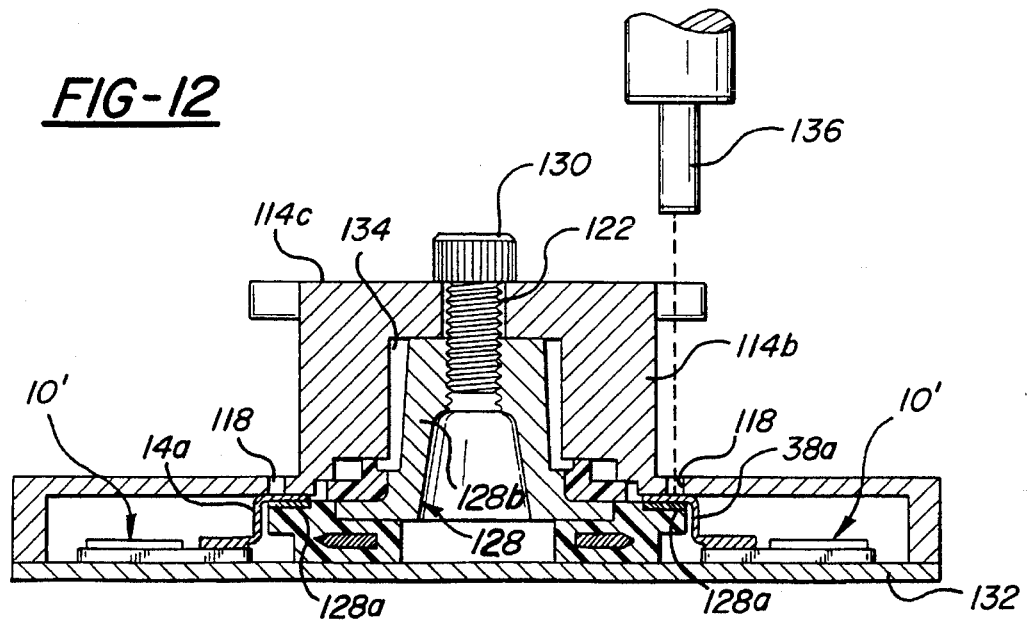
FIG. 12 shows a sectional view along the line 12—12 of FIG. 11.
Figure 13:
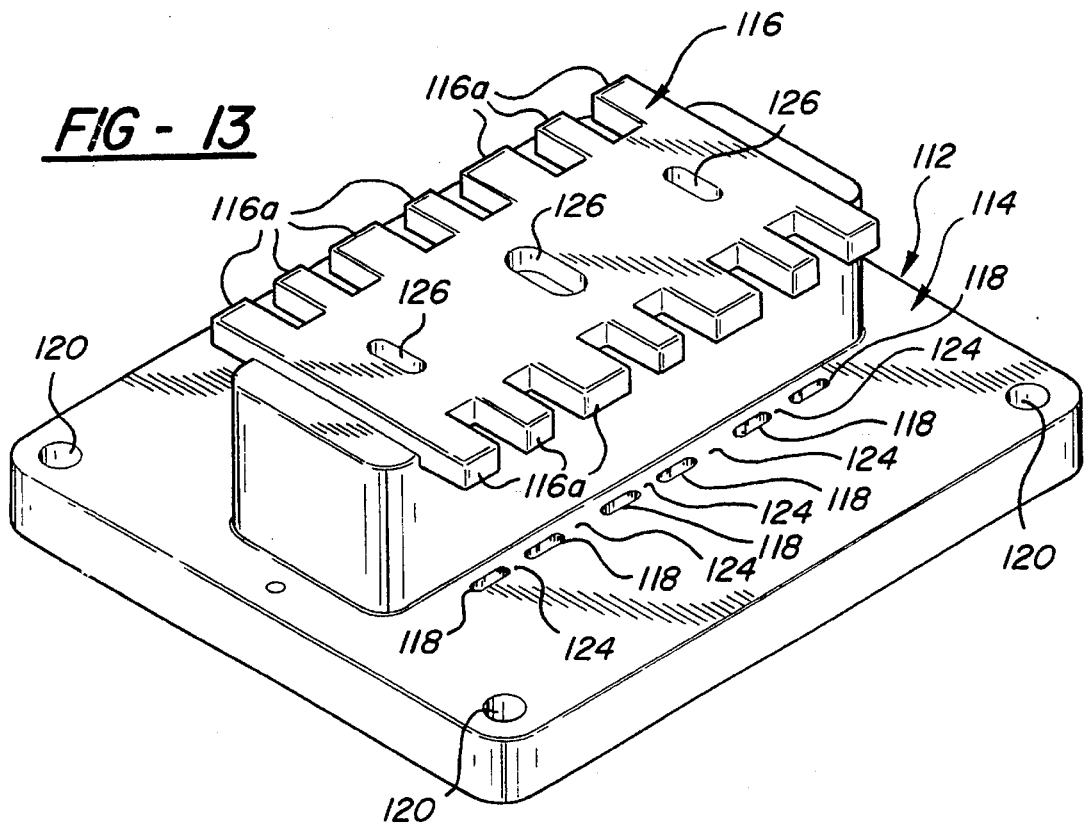
FIG. 13 shows a perspective view of the upper surface of the welding fixture of FIG. 11 before attachment to a module for welding.

We propose using an improved masking fixture that would also have alignment means and clamping means. Such a fixture is shown in FIGS. 11–13. As already seen, if a pair of terminals are coplanar and aligned, the substrate subassembly tabs for them can be welded in a single operation. As indicated above, the five layer substrate subassembly of FIG. 2 has two connector tabs, 14a and 38a. If the free ends of connector tabs 14a and 38a are coplanar, and if the terminal member contact areas are coplanar and aligned, all tabs can be concurrently welded. Such a module and substrate subassembly combination is described and claimed in U.S. Pat. No. 5,444,295, issued Aug. 22, 1995, and incorporated by reference. Significant portions of it are shown in connection with FIGS. 11–13 hereof.

In the FIGS. 11–13 module, input and output terminal contact areas are coplanar but spaced side-by-side for each pair of substrate subassembly connector tabs. The connector tabs 14a and 38a overlap their respective contact areas. Then, a single fixture is placed over the module, clamping both tabs of each pair in place but leaving a suitable portion of each exposed for welding. In such instance, both of tabs 14a and 38a can be welded in a single operation, if they are appropriately aligned. In the FIGS. 11–13 module, terminal posts are in place at the time of welding, making use of a flat plate as a fixture impractical.

As shown in FIGS. 11–13, we prefer to use an improved fixture, which is indicated by reference numeral 112 in FIGS. 11–13. The Coplanar Linear Dual Switch Module has coplanar connecting portions 128a on a terminal plate. The Coplanar Linear Dual Switch Module has two lines of five layer substrate subassemblies 10' shown in FIG. 2. They are affixed to a module baseplate 132 on opposite sides of a central terminal member 128, to form a subassembly. The substrate subassemblies 10' are in two lines. The connector tabs 14a and 38a of the substrate subassemblies 10' of one line face the other line. In other words, they face the central terminal member 128, and its coplanar connecting portions 128a. The FIG. 2 substrate subassemblies 10' are diagrammatically shown in the cross-sectional view of FIG. 12. The free end portions of tabs 14a and 38a are bent to be coplanar for use in the FIGS. 11–13 module. Hence, they can be concurrently clamped against the module coplanar terminal plate connector portions 128a, and welded in a single operation.

The elegance of fixture 112 in FIGS. 11–13 is its simplicity in design. Yet, it is complex in its function. It comprises only two parts, which are a conformal lower member 114 and a planar upper or masking member 116. The conformal member 114 includes a plate-like portion 114a and an elongated raised, or tower, portion that has a side wall 114b and a top wall 114c.

Figure 14:
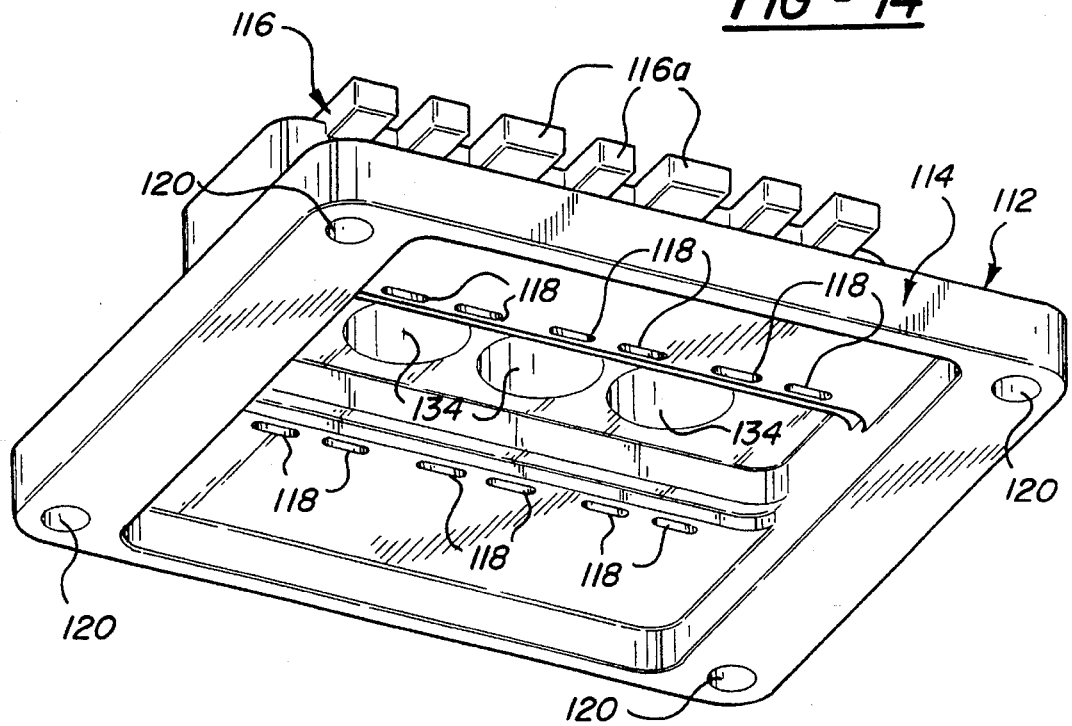
FIG. 14 shows a perspective view of the lower surface of the welding fixture shown in FIG. 13.

Plate-like portion 114a has two lines of spaced slots 118 in it. The second line of slots 118 can be better seen in FIG. 14. The lines are parallel and disposed on opposite sides of the tower. The slots 118 are spaced to correspond to the spacing of the centers of the tabs 14a and 38a. The length of each slot 118 is narrower than the width of the tab 14a or 38a over which it is disposed. Further, the length of the slot is centered on the width of its respective tab 14a or 38a. Accordingly, the opposite edges of each tab are covered by plate portion 114a. The width of the tabs, of course, is centered on their respective terminal member contact areas 128a.

The plate portion 114a of the conformal member 114 is clamped against the tabs. This holds the tabs against their respective terminal plate contact areas 128a but also seals the periphery of slots 118 against the tabs. Hence, when the tabs are welded, no welding flash can detrimentally affect the substrate subassemblies 10' or the terminal member 128.

Welding flash is also prevented from contacting the terminal posts 128b by walls 114b and 114c that form the tower portion of conformal member 114. Thus the conformal member 114 exposes selected interior portions of the connector tabs 14a and 38a. However, it completely isolates the remainder of the baseplate subassembly from undesirable welding flash.

The clamping feature of the fixture 112 is analogous to the clamping feature of fixture 94 shown in FIGS. 7–10. For comparison, it should be noted that in FIGS. 7–10, all the connector tabs 14a that are to be welded are pressed down against their respective contact areas by an overlying conformal fixture assembly 94. Fixture 94 is pressed down against tabs 14a by a bolt 104 engaging threaded recess 60 in a central terminal member.

In FIGS. 11–13, plate portion 114a of conformal member 114 presses down on tabs 14a and 38a. The pressure is applied by bolts 130 extending through openings 122 in the tower top wall 114c, acting through tower side wall 114b. It can be seen that the tower portion can be a solid, with openings 134 to accommodate the terminal posts 128b. On the other hand, the tower portion can be hollow, in which case there would only be one opening 134. However, opening 134 would be large enough to accommodate all of the terminal posts 128b. Correspondingly, side wall 114b would be thinner.

As indicated above, bolts 130 engage threaded recesses in the upper ends of the module terminal members 128. This clamping can also be produced by other threaded means, for example a threaded nut trapped in the terminal members 128. Other means might also be used but we like the convenience of using means already available on the module baseplate subassembly. Any means can be used that clamps the fixture enough to produce a useable weld and yet protect the underlying module parts from welding flash.

The tower top wall 114c has at least two openings 122, preferably three, corresponding to recesses in the terminal member ends. Three openings provides a more uniform clamping action. However, it also facilitates close alignment of conformal member 114 on the module baseplate. Accordingly, an alignment lip on the periphery of the underside of plate portion 114a can be omitted. This is especially true if the plate portion 114a of the fixture 114 also has openings 120 in its corners that correspond to openings (not shown) in the module baseplate. In the latter instance, the module baseplate could be disposed on a supporting surface (not shown), with locating pins of that surface disposed in the module baseplate holes and extending up above the baseplate upper surface. The fixture can be located on the baseplate with the locating pins also extending up through holes 120 of the fixture plate 114a. Then the bolts can be placed through the tower openings into the terminal member ends and tightened. This provides a simple and positive alignment of the conformal member 114 on the module baseplate before clamping bolts are tightened. Such positive alignment, prevents a possible baseplate breakage that might occur if the fixture had a lip on its underside and was not aligned when tightened.

It should be mentioned that supporting surface (not shown) during welding could alternatively have threaded recesses, instead of pins, for location of the baseplate and the fixture plate 114a. Then, clamping force could also or alternatively be applied through openings 120 at the corners of the fixture, if that was desired.

Another comparison with the fixture of FIGS. 7–10 can be made. In the FIGS. 7–10 fixture 94, the welding slot 97 is an annulus, which provides a continuous opening for welding of all connector tabs. In such a fixture, the edges of the tabs 14a are exposed in the weld slot 97. However, they are protected from the welding beam 106 by the copper masking blocks 94c. In FIGS. 11–13, the weld openings 118 do not leave the edges of the tabs 14a and 38a exposed. Such a fixture would be functionally adequate for welding the tabs with a laser or electron beam apparatus 136 that is turned on and off for the welding of a given tab, and then the module and/or the beam relocated to the next tab for the next weld.

On the other hand, we prefer to operate the welding beam apparatus 136 continuously during the welding of all the tabs. In such instance, in order to weld all the locations desired, the beam and/or the module has to move once the welding beam is turned on. For the fixture of FIGS. 11–13, the welding beam is turned on to weld tabs 14a and 38a exposed in one row of openings 118. The welding beam traverses the length of the line of openings 118, and is then turned off. This welds all the tabs 14a and 38a in that line. The welding beam and/or the module is then relocated to weld the tabs 14a and 38a exposed in the other line or row of openings 118. The welding beam is then turned on again to weld the tabs 14a and 38a exposed in the other line or row of openings 118. The welding beam traverses the length of the other line of openings 118, and is then turned off. This welds all the tabs 14a and 38a in that other line.

Since the welding beam is operated continuously, areas 124, between and in line with openings 118, would be exposed to the welding beam. These areas would be exposed to the heat of the welding beam and be eroded by it if not protected. For this reason, we prefer to protect areas 124 from the welding beam. They could be protected by replaceable and reversible copper blocks (not shown) affixed to plate 114a at the ends of the weld openings 118. They could be held in location by upstanding abutments on plate 114a and pinned to them. This would be analogous to the use of copper blocks 94c of FIGS. 7–13.

However, we have conceived of a different weld beam masking arrangement that we prefer more for commercial production. We provide a plate-like copper upper masking member 116. Masking member 116 is a generally rectangular flat plate of copper. The flat plate 116 has a row of parallel fingers 116a extending from each of its opposed long sides. When viewed from a location above plate 116 and perpendicular to the upper surface of plate 114a, the free ends of fingers 116a overly the areas 124 on plate portion 114a. In addition, they also slightly overly the ends of slots 118 in plate 114a, to offer a bit more protection and tolerance in locating conformal member 114 on the module baseplate 132. It can thus be seen that the finger free ends protect areas 124 from erosion by the welding beam.

As can be seen, the copper plate 116 has openings 126 that correspond in location to openings 122 in top wall 114c of conformal member 114. Accordingly, plate 116 can be a separate and replaceable member that is held against top wall 114c of the conformal member 114 by the same bolts 130 that clamp conformal member 114 against the module baseplate 132. In such instance, copper plate 116 is readily assemblable in positive alignment over interjacent areas 124 but yet readily replaceable when worn. As compared to fixture 94 of FIGS. 7–10, only one member has to be stocked as a mask for all interjacent areas 124, and replacing one member replaces the masking for all interjacent areas 124. Since the welding tabs 14a and 38a are generally symmetrically disposed, the plate is symmetrical and can be flipped over for added life.

The thickness of the copper plate 116 is not particularly critical. It has to be thick enough to be self supporting and withstand repeated exposure to the welding beam before needing replacement. By way of example, we currently prefer a thickness of about 0.187 inch thick copper plate. However, it should be recognized that other thicknesses could be used. Also, it should be mentioned that while we prefer to make masking plate 116 out of copper, other materials might be found that also would be acceptable.

Further, it should be mentioned that copper plate 116 could be elongated and widened at one or both ends. If so, the elongated end would cover a path between the two rows of weld openings 118 on opposite sides of the tower in plate 114. In such instance, the enlarged end of masking plate 116 would allow welding of all the tabs in both rows in a single, continuous, welding step. This single welding step could alternatively be accomplished by affixing a small copper plate on the upper surface of plate portion 114a. The small copper plate would cover the track made by the laser or electron welding beam in traversing from one row of weld openings 118 to the other. The small copper plate could be arcuate or U-shaped, depending on the track of the welding beam. This smaller copper plate would, of course, preferable be replaceable and could be of the same thickness as masking plate 116. However, at the present time we prefer not to use this latter feature in commercial production. Instead, we prefer to weld one line of tabs, turn off the beam, align to the second line of tabs, and then turn on the beam again.

The beam can move with respect to a stationary fixture, or the beam can be stationary and the fixture moved in relation to the beam. We currently prefer to move the fixture instead of the beam, and to move it in straight lines while the beam is on. Accordingly, if a plurality of substrate subassemblies are disposed in more than one row, separate passes through the welding beam for each row is preferred.

In welding both the coaxial type of module and the linear type of module, the concept is still the same. The laser or electron beam need not be turned off during welding. Hence, a less expensive and more controllable weld can be easily obtained. Still further our fixture 112 clamps the foil connector tabs of the substrate subassemblies against underlying terminal plate contact areas 128a. Weld energy is directed to the tab and transmitted to the underlying contact area of the terminal plate. Highly sophisticated semiconductor integrated circuit chips can be readily and rapidly connected to high energy terminals on a commercial production basis. Reliability and durability of the welds are assured at low cost, even though the welds will be subjected to relatively high current flows during semiconductor device operation.

Accordingly, it should be appreciated that the basic principles of this invention have been described in connection with certain specific embodiments. On the other hand, it is understood that the basic principles of this invention can take the form of many other embodiments without departing from the spirit of this invention. It is intended that the claims not be limited to the precise embodiments herein disclosed, but only limited as expressly recited in the claims hereof.

The embodiments of the invention in which an exclusive property or privilege is claimed are defined as follows:

1. A fixture for energy beam welding connector tabs on a plurality of semiconductor subassemblies in a circular array to an annular contact surface of a circular terminal member while protecting semiconductor device chips of said subassemblies from welding flash, said fixture comprising:

a plate-like member having a circular aperture therein of a predetermined diameter for covering said semiconductor assemblies but not end portions of said connector tabs;

a central circular member coaxial with said circular aperture and of a slightly smaller diameter than said predetermined diameter but large enough to cover tips of said tab end portions, effective to cover said terminal member but expose an annulus of alternating tab near-end portions and terminal contact surface portions;

radial support means extending between said central and plate-like members over said annulus;

means on said support means for masking said alternating terminal contact portions, effective to leave only said tab near-end portions exposed;

means on said fixture for cooperation with said terminal member to clamp said central and plate-like members against said tabs on said terminal member contact surface and concurrently form a welding subassembly in which semiconductor devices are protected from welding flash.

2. The welding fixture of claim 1 in which said central member is tubular and said radial support means is a plurality of by flying buttresses between said tubular central member and said plate-like member.

3. The welding fixture of claim 2 in which each flying buttress has a consumable covering for protecting the buttresses from exposure to a continuous electron beam having an axis parallel to said tubular central member, and said consumable covering is also wide enough to mask terminal contact portions and edges of said tab near-end portions that are exposed in said annulus from said continuous electron beam.

4. The welding fixture of claim 3 in which said consumable covering on each buttress is a copper element affixed to each flying buttress.

5. The welding fixture of claim 3 in which said consumable covering on each buttress is a copper element that is reversible on its buttress, effective to prolong life of the copper element.

6. The welding fixture of claim 1 in which said central member and said plate-like member have appreciable mass, effective to help prevent excessive heating of said semiconductor chips during welding.

7. The welding fixture of claim 1 in which said clamp means is a bolt threaded into a terminal member threaded aperture for securing a bus conductor to said terminal.

8. A fixture for energy beam welding free ends of connector tabs, on a plurality of semiconductor subassemblies that are disposed in a linear array, to a line of corresponding terminal contact surface areas while protecting semiconductor device chips of said semiconductor subassemblies from welding flash, said fixture comprising:

a conformal plate-like member for covering said semiconductor assemblies;

an aperture in said plate-like member that exposes a selected portion of each connector tab;

means on said plate-like member for covering terminal members upstanding on a support to which said semiconductor subassemblies are affixed;

means for clamping said connector tabs between said plate-like member and said corresponding terminal contact surface areas; and means for masking portions of said plate-like member other than over said connector tabs from exposure to eroding force of an energy beam;

effective to permit welding of said connector tabs to said corresponding terminal contact surface areas by a continuous energy beam without detrimental effects on said plate-like member or on semiconductor devices on said substrate subassemblies.

9. The welding fixture of claim 8 in which a discrete aperture in said plate-like member is disposed over each connector tab without exposing edge portions of the connector tab, whereby said aperture has a periphery sealed against said connector tab and a series of apertures is formed in a line; and said means for masking portions of said plate-like member from exposure to the energy beam comprises a second plate-like member affixed to the first-mentioned plate-like member and said second plate-like member has a line of apertures corresponding to the line of apertures in the first-mentioned plate-like member.

10. The welding fixture of claim 9 in which the means on said plate-like member for covering terminal members upstanding on a support to which said semiconductor subassemblies are affixed includes an integral raised portion of said plate-like member;

the means for clamping said connector tabs between said plate-like member and said corresponding terminal contact surface areas includes apertures in said plate-like member, corresponding threaded means on said terminals, and bolt means; and the apertures in the second-mentioned plate-like member are spaces between fingers of the second-mentioned plate-like member, which fingers extend over areas of the first-mentioned plate-like member that are to be protected from the energy beam.

* * * * *